(12) United States Patent
Tsuneda et al.

(10) Patent No.: US 6,491,491 B1
(45) Date of Patent: *Dec. 10, 2002

(54) ARTICULATED ROBOT

(75) Inventors: Haruhiro Tsuneda, Nagano (JP); Yasuyuki Kitahara, Nagano (JP)

(73) Assignee: Sankyo Seiki Mfg. Co., Ltd., Nagano (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/173,882

(22) Filed: Oct. 16, 1998

(30) Foreign Application Priority Data

Oct. 30, 1997 (JP) ............................................. 9-299145
Nov. 6, 1997 (JP) ............................................. 9-304720

(51) Int. Cl.⁷ ................................................ B25J 19/02
(52) U.S. Cl. ..................................... 414/744.5; 414/936
(58) Field of Search ............................. 414/936, 744.1, 414/744.5

(56) References Cited

U.S. PATENT DOCUMENTS

| | | | |
|---|---|---|---|
| 4,675,516 A | | 6/1987 | Guion |
| 4,693,663 A | | 9/1987 | Brenholt et al. |
| 5,306,380 A | * | 4/1994 | Hiroki ..................... 414/744.5 |
| 5,746,565 A | * | 5/1998 | Tepolt ..................... 414/744.5 |
| 5,944,476 A | * | 8/1999 | Racchi et al. ............... 414/936 |

FOREIGN PATENT DOCUMENTS

| | | |
|---|---|---|
| EP | 0556865 | 8/1993 |
| EP | 0617488 | 9/1994 |
| EP | 0774732 | 5/1997 |
| EP | 0913236 | 5/1999 |
| FR | 2774791 | 8/1999 |

OTHER PUBLICATIONS

Data Sheet for Keningston Laboratories WH–3 Water Handling, 1986.*
Robot Mechanism (1986).*
English Abstract of FR 2774791.

* cited by examiner

Primary Examiner—Donald W. Underwood
(74) Attorney, Agent, or Firm—Reed Smith LLP

(57) ABSTRACT

An articulated robot comprises a movable first transferring portion and a second transferring portion movably supported in relation to the movable first transferring portion by a joint portion. A workpiece is positioned at a position, where a workpiece positional deviation detector is located, by a hand portion formed at an end of the second transferring portion. The workpiece positional deviation, detector detects the amount of deviation in the position of the workpiece. A positioning portion of the workpiece and a sensor portion for detecting deviations of the workpiece are formed either at the first transferring portion to the second transferring portion which form the articulated robot. A detecting operation by the sensor portion and transferring of the first and second transferring portions are enabled when the workpiece is positioned at the positioning portion of the articulated robot.

9 Claims, 16 Drawing Sheets

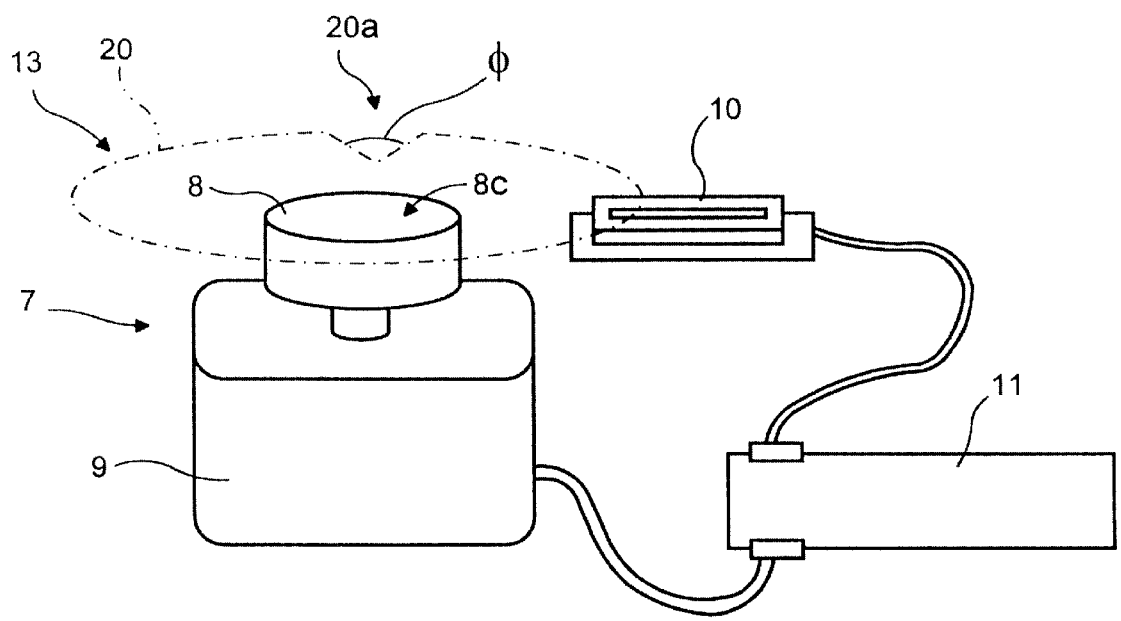
F I G. 2
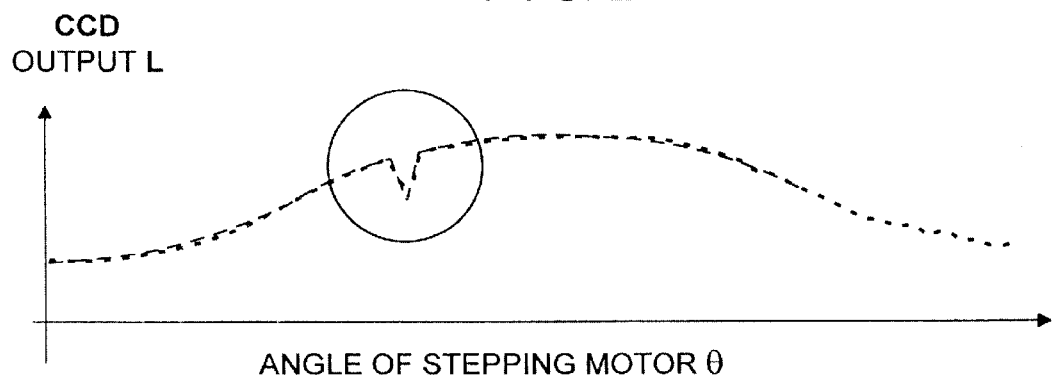
F I G. 3
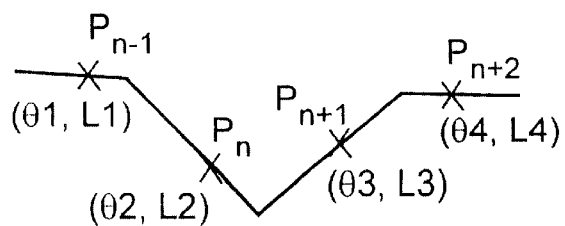
F I G. 4

- OBTAINING DATA ABOUT ROTATION OF TURN TABLE
- DETECTING NOTCH, TRANSFORMING POLAR COORDINATES · ORTHOGONAL COORDINATES
- TRANSFERRING TO THE VICINITY OF MEASUREMENT POSITION
- CALCULATING THE AMOUNT OF FINE CORRECTION
- FINE CORRECTION
- CALCULATING CIRCLE BY COMPARISON

3 SECONDS
4 SECONDS

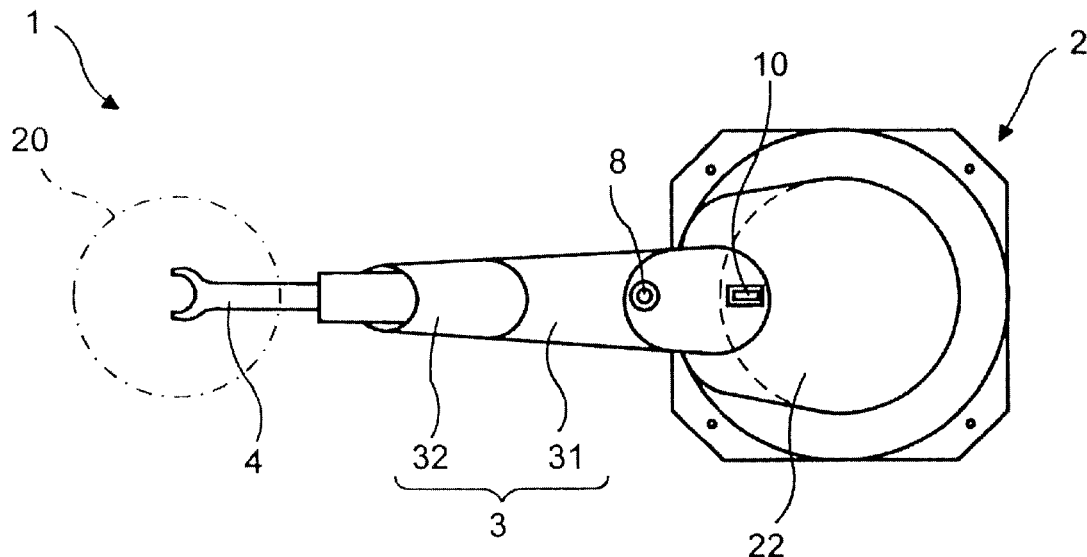
F I G. 7
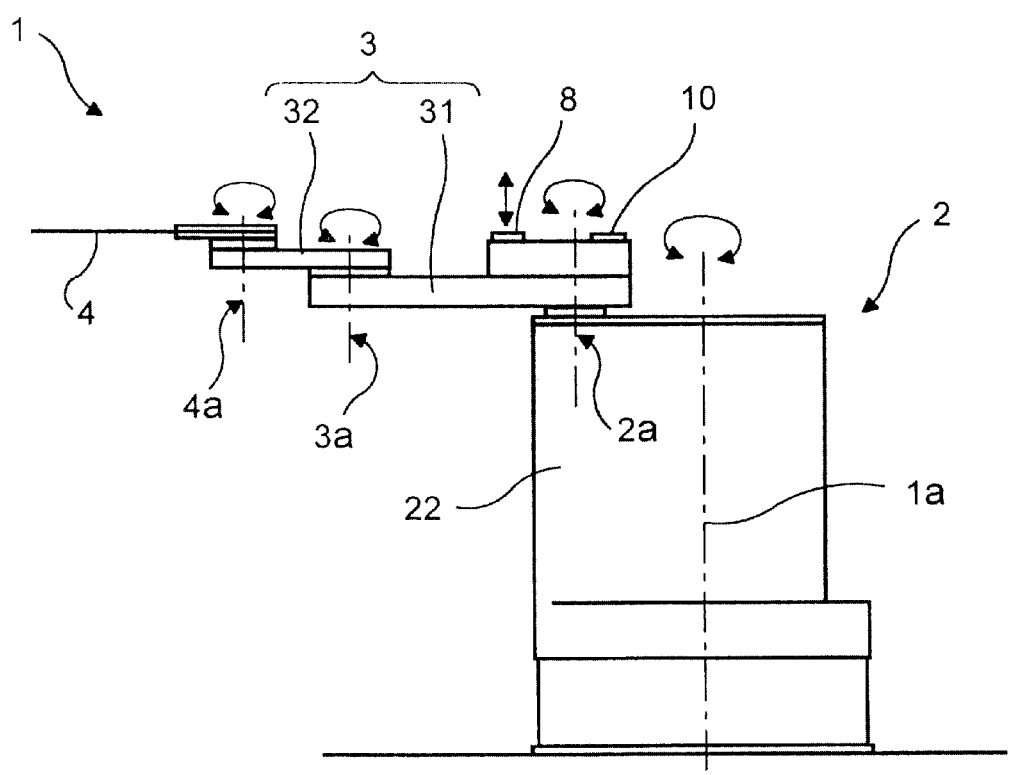
F I G. 8

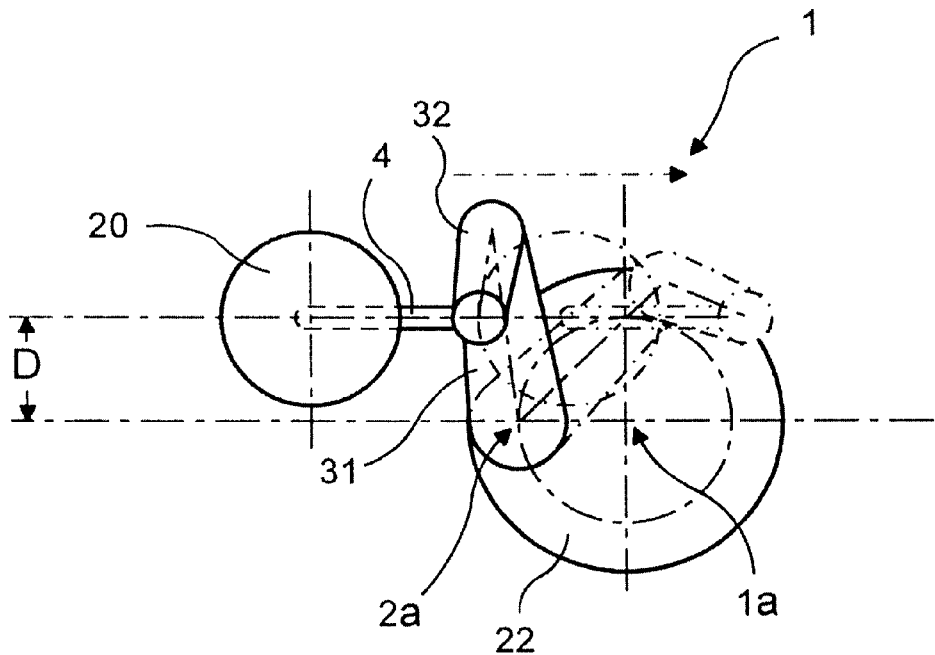
F I G. 14A
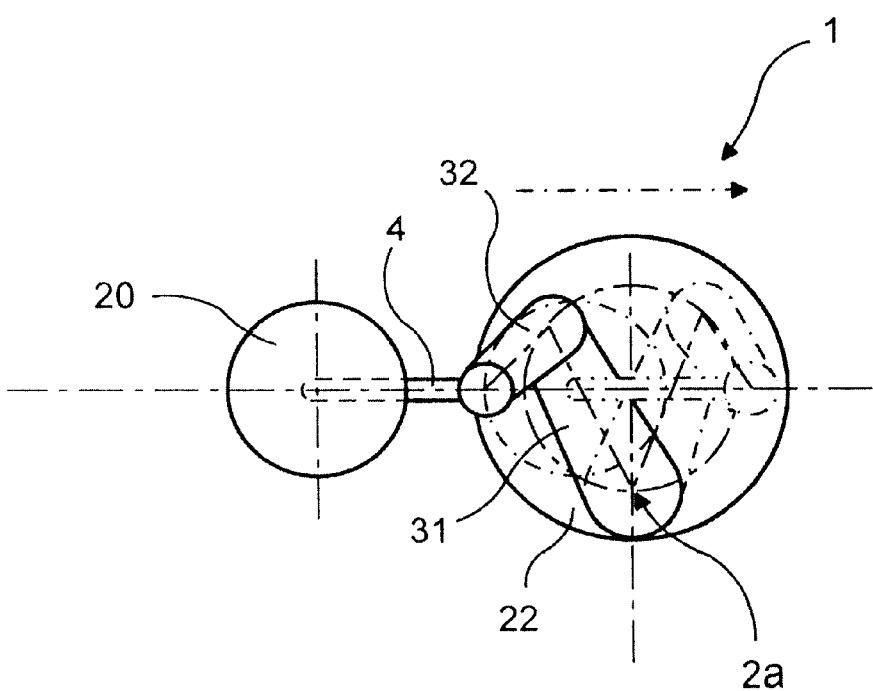
F I G. 14B

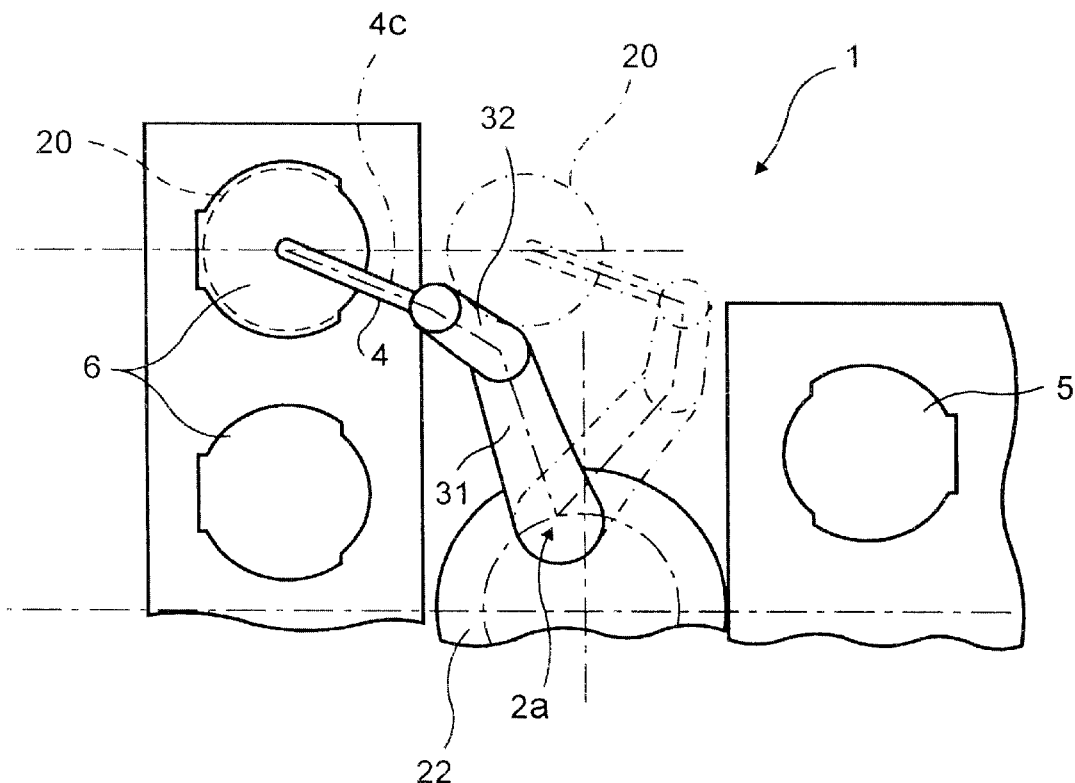
F I G. 15

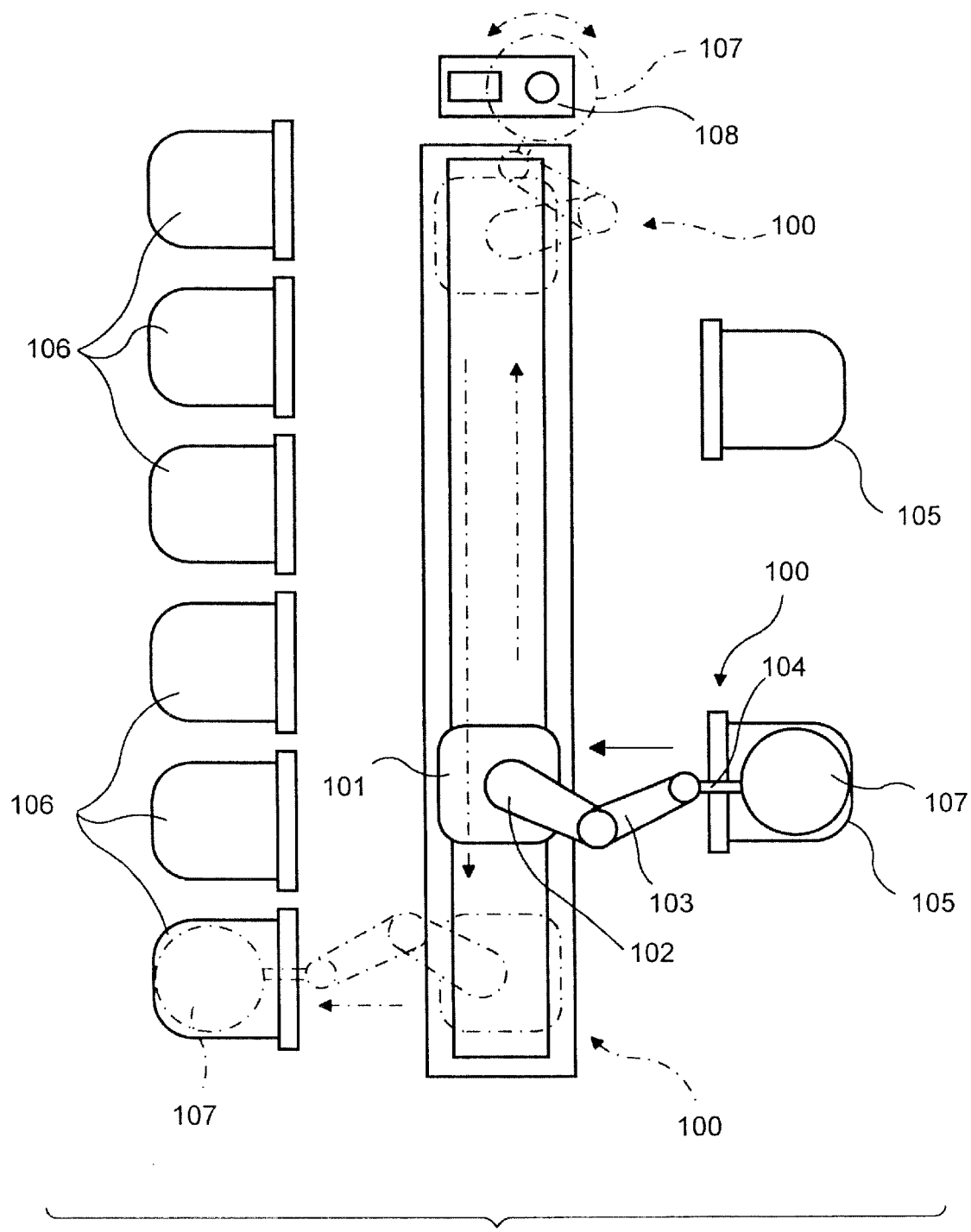
F I G. 17

ARTICULATED ROBOT

BACKGROUND OF THE INVENTION a) Field of the Invention

The present invention relates to an articulated robot. Furthermore, the present invention relates to an articulated robot which transfers a workpiece, such as a semiconductor wafer.

b) Description of the Related Art

An articulated robot is used for transferring a workpiece such as a semiconductor wafer from a cassette to a processing device for photo lithography, deposition and etching. For example, as shown in FIG. 16(A), articulated robot 100 comprises base 101, first arm 102, which is rotatably supported by base 101, second arm 103, which is rotatably supported by first arm 102, and hand portion 104 which is supported by the end of second arm 103. Articulated robot 100 transfers workpiece 107 from cassette 105 to processing device 106.

In the case where a semiconductor wafer is used as workpiece 107, it is necessary to maintain the direction of workpiece 107 for a thermal processing and deposition since the crystals of each semiconductor wafer have a directional property. Therefore, it is required to keep all workpieces 107, ..., 107 on processing device 106 in the same direction when they are transferred.

For the above reasons, a mark, such as a notch and a D flat, is formed at a given position on the edge of workpiece 107 while a workpiece rotating device, called aligner 108, having a means to detect the mark is formed, separate from cassette 105 and processing device 106 as shown in FIG. 16. As shown in FIGS. (A) through (C), workpiece 107, which is removed from cassette 105 by hand portion 104, is first mounted on aligner 108 (FIG.(D)); after the direction of the workpiece is aligned in a given direction by turning it, workpiece 107 is transferred to and mounted on processing device 106 in a given direction (FIGS. (E) and (F)).

However, as shown in FIG. 17, if base 101 is formed such that workpiece 107 can be transferred by sliding to each of processing devices 106, ..., 106, which are connected in parallel, the time required to transfer workpiece 107 becomes longer. In other words, it is necessary for workpieces 107, ..., 107 to pass through aligner 108 to align the workpieces in one direction, and there is usually only one aligner 108 for two cassettes 105, 105 and a plurality of processing devices 106, ..., 106. Therefore, if one wants to transfer workpiece 107 from lower cassette 105 to processing device 106 at the bottom in the figure, workpiece 107 must pass through aligner 108; as a result, distance of transfer by robot 100 becomes longer such that it takes a longer time for workpiece 107 to be transferred.

Also, if one wants to transfer workpiece 107 from upper cassette 105 to processing device 106 at the top in the figure, workpiece 107 cannot be transferred until the orientation for alignment by aligner 108 is complete; therefore, robot 100 shall be idling while the orientation is carried out.

On the other hand, articulated robot 100, which transfers a workpiece such as a semiconductor wafer from a cassette to a processing device and vice versa, generally comprises two arms 102, 103 and hand portion 104, as shown in FIG. 18, such that workpiece 107 can be transferred along a linear path. In the case of such an articulated robot 100, or articulated robot 100 having three arms 102, 103, 113 as shown in FIG. 19, hand portion 104 holding workpiece 107 is linearly transferred in the axial direction of the hand portion such that workpiece 107 can be transferred without being rotated.

There are known transportation mechanisms such as a belt and pulley, in which two arms 102, 103 can be formed to be mechanically connected, as a means to linearly move hand portion 104. Due to these mechanisms, articulated robot 100 limits movements of arms 102, 103 (, 113). Additionally, each of workpieces 107 mounted at various positions in a connected plurality of cassettes can be transferred from each position by being held by hand portion 104.

However, when hand portion 104 is transferred while the axis of hand portion 104 passes through the vicinity of the rotational center of arm 102, that is, when the center of transferred workpiece 107 shows a path passing the vicinity of rotational center 116, a rapid rotation of arm 102 is required at rotational center 116 of arm 102, and such a position is called a singularity. As a result, an excessive load may be caused in the movement of arms 102, 103 of the above mechanism. In other words, as shown in FIGS. 20(A) through (C), when support point 117 of hand portion 104 passes the vicinity of rotational center (singularity) 116 of arm 102, each of arms 102, 103 are required to move around rotational center (singularity) 116 for about 180 degree. Additionally, if workpiece 107 is transferred at a constant speed, each of arms 102, 103 must be rapidly and vigorously rotated such that unnatural movement will be caused therein. This phenomena is also observed in articulated robot 100 having three arms 102, 103, 113 and hand portion 104 as shown in FIG. 21.

On the other hand, as shown in FIG. 22, articulated robot 100 having direct-acting mechanism 119 capable of a horizontal transfer together with base 121 has been suggested. According to this mechanism, horizontal transfer of workpiece 107 is possible while hand portion 104 is distant from rotational center 116 of arm 102. Consequently, hand portion 104 does not have to pass the vicinity of rotational center 116 of arm 102; thus, the above problems related to the generation of a singularity can be solved. Nonetheless, to form articulated robot 100 such that it is capable of a linear movement including base 121, a space for direct-acting mechanism 119 is needed. In addition to dust generated by direct-acting mechanism 119 during transfer, it is difficult to seal the dust inside the robot such that the robot is not able to be used in a clean room.

OBJECT AND SUMMARY OF THE INVENTION

Therefore, a primary object of the present invention is to improve the above problems which an articulated robot to transfer a workpiece, such as a semiconductor wafer, conventionally has had. More specifically, the present invention intends to provide an articulated robot in which workpieces can be transferred while orientation of the workpieces is carried out such that efficiency of transfer of workpieces is improved. Another object is to provide an articulated robot in which transfer of workpieces can be carried out without unnatural movement in arms and generation of dust is minimized during transfer of workpieces.

In accordance with the invention, an articulated robot comprises a movable first transferring portion and a second transferring portion movably supported in relation to the movable first transferring portion by a joint portion. A workpiece is positioned at a position, where a workpiece positional deviation detecting means is located, by a hand portion formed at an end of the second transferring portion. The workpiece positional deviation detecting means detects the amount of deviation in the position of the workpiece. A positioning portion of the workpiece and a sensor portion for detecting deviations of the workpiece are formed either at the first transferring portion or the second transferring portion which form the articulated robot. A detecting operation by the sensor portion and transferring of the first and second transferring portions are enabled when the workpiece is positioned at the positioning portion of the articulated robot.

BRIEF DESCRIPTION OF THE DRAWINGS

In the drawings:

FIG. 2 is an oblique view of an aligner forming a workpiece positional deviation detecting means;

FIG. 3 is a graph showing the output of an optical measurement by a line CCD;

FIG. 4 is an enlarged view of a circled area in FIG. 3;

FIG. 7 is a plan view showing another example of an articulated robot of the present invention;

FIG. 8 is a side view of the articulated robot shown in FIG. 7;

FIGS. 14(A) and 14(B) are plan views showing another mode to transfer a workpiece by the articulated robot; FIG. 14(A) is in the case of offset length D is other than zero, and FIG. 14(B) is in the case of offset length D is equal to zero;

FIG. 15 is a plan view showing another mode to remove a workpiece mounted in a cassette by the articulated robot;

FIG. 17 is a plan view showing a process of transferring a conventional workpiece;

DESCRIPTION OF THE PREFERRED EMBODIMENTS

The following describes a structure of the present invention for detail in relation to drawings.

Figure 1:
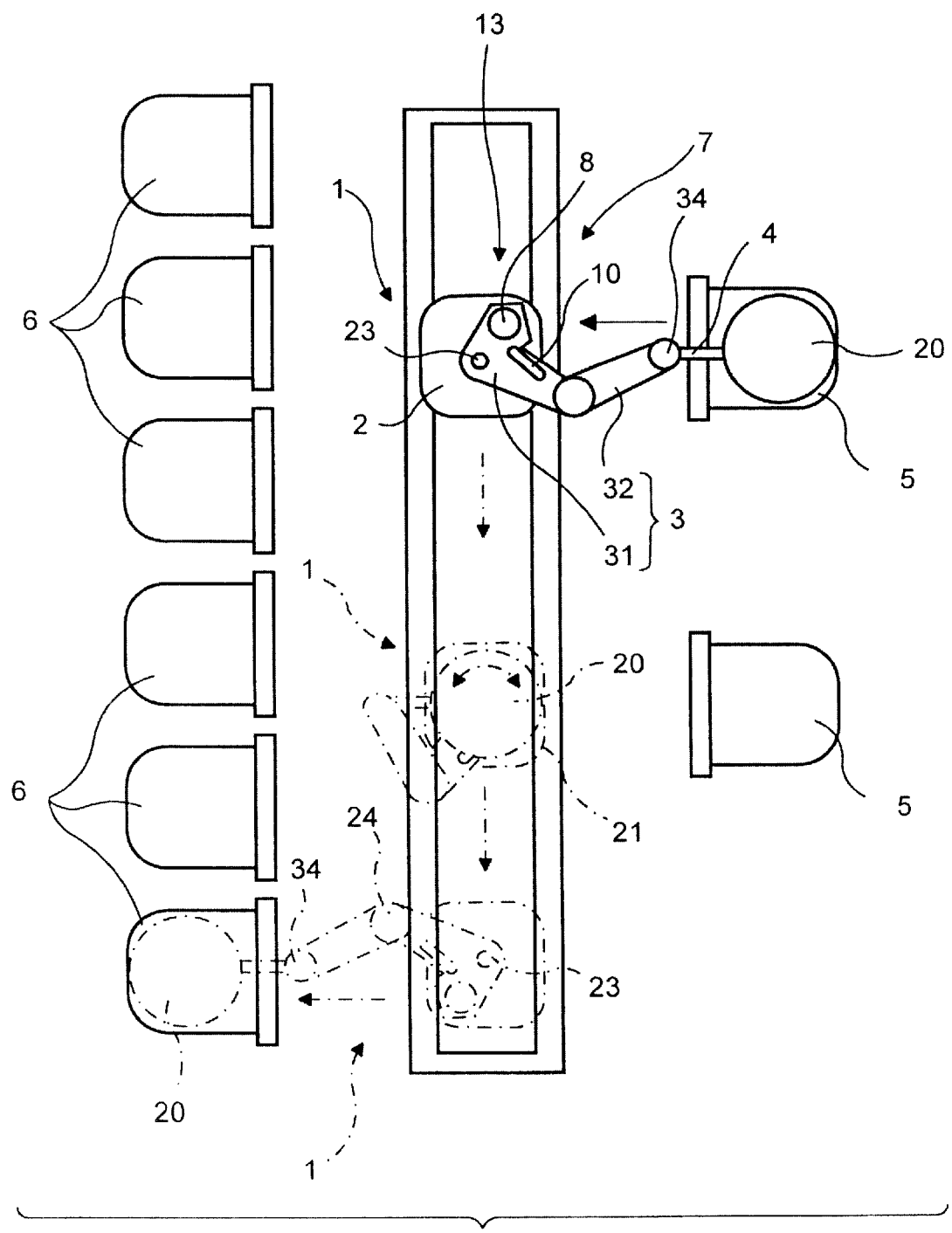
FIG. 1 is a plan view showing an example of an articulated robot of the present invention.

FIG. 1 shows an embodiment of an articulated robot of the present invention, more specifically, an articulated robot which can transfer workpieces while carrying out orientation of workpieces. Articulated robot 1 comprises a SCARA (Selective Compliance Assembly Robot Arm: horizontal articulated) articulated transferring portion consisting of first transferring portion 2, second transferring portion 3, which is transferred by first transferring portion 2 and which itself moves, hand portion 4, which supports workpiece 20 transferred by second transferring portion 3. First transferring portion 2 is slide transferring portion 21 which transfers in the vertical direction in FIG. 1 and to which second transferring portion 3 and hand portion 4 are rotatably connected via joint portions 23, 24. Slide transferring portion 21 is linearly transferred by a known sliding mechanism (not shown in the figure) such that articulated robot 1 can be positioned in front of cassettes 5, 5 and processing devices 6, . . . , 6. Also, second transferring portion 3 comprises first arm 31 and second arm 32 which is connected to first arm 31. Then, hand portion 4, formed at the end of second transferring portion 3, that is, the end of second arm 32, places workpiece 20 at workpiece positional deviation detecting means 13 such that the positional deviation of workpiece 20 can be detected.

Positioning portion 8 for workpiece 20 and sensor portion 10 to detect positional deviation of workpiece 20 are formed on second transferring portion 3 of articulated robot 1 (they may be formed on transferring portion 2). Hence, detection by sensor portion 10 and transfer by transferring portions 2 and 3 can be simultaneously carried out while workpiece 20 is positioned at positioning portion 8 of second transferring portion 3. Sensor portion 10 is to detect notch 20a formed at a given position on the edge of workpiece 20 (see FIG. 2). In articulated robot 1 of the present invention, in which second transferring portion 3 comprises first arm 31 and second arm 32, positioning portion 8 and sensor portion 10 may be formed on first transferring portion 2 or may be formed on first arm 31 as shown in FIG. 1.

Positioning portion 8 is formed such that it is movable in the vertical direction as shown in FIG. 8 such that workpiece 20 can be passed to hand portion 4; it is also formed such that workpiece 20 can be fixed on the upper surface. A means to fix workpiece 20 onto positioning portion 8 is not limited; a suction means is used herein. Therefore, when the center of workpiece 20 is positioned straight above positioning portion 8 by hand portion 4, which supports workpiece 20, positioning portion 8 ascends such that it can receive workpiece 20 by suction while it descends after the orientation as a given detection operation is complete; as a result, hand portion 4 supports workpiece 20 again.

Furthermore, positioning portion 8 is formed to be movable independent of movements of transferring portions 2 and 3. In other words, a rotating means is formed on first arm 31 such that the orientation can be carried out at the positioning portion independent of movements of transferring portions 2, 3. This rotating means, as shown in FIG. 2, is a turn table which is driven by driving means 9 such as a motor. In addition, analyzer 11 is formed on first arm 31 of articulated robot 1 to analyze data obtained by sensor portion 10. Aligner 7 is formed of positioning portion 8, driving means 9, sensor portion 10 and analyzer 11. Aligner 7 detects both rotational deviations and deviations of the central positions of workpiece 20; therefore, in this embodiment, it functions as workpiece positional deviation detecting means 13. Therefore, the following discusses operation of aligner 7 by using an example; first, an orientation function of aligner 7 is briefly explained.

Figure 5:
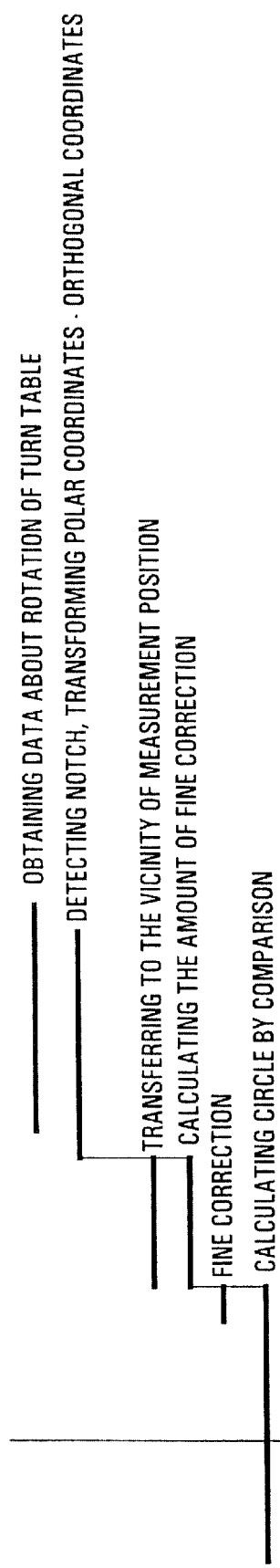
FIG. 5 is a schematic drawing showing a calculation process for orientation of a workpiece.

Aligner 7 has an orientation function in which it rotates workpiece 20 and detects notch 20a (or a cut surface called orientation flat) formed on the edge of workpiece 20 to align the direction and retained angle of all workpieces 20, . . . , 20. In the case of aligner 7 shown in FIG. 2, a turn table (spindle), stepping motor (including a decelerator) and a line CCD sensor are used as positioning portion 8, driving means 9 and sensor portion 10, respectively. The orientation function is structured such that optical measurement by sensor portion 10 and multiple-point analyses by analyzer 11, including a microprocessor, are carried out while rotating positioning portion 8, in turn, rotating workpiece 20. Therefore, in order to perform the orientation of workpiece 20 by using aligner 7, the positions of the outer edge surface of workpiece 20 is detected at a 1 mm pitch by sensor portion 10 while rotating workpiece 20 mounted on turn table 8. In this case, the rotation of workpiece 20 is maintained even after the detection of notch 20a on the outer edge of workpiece 20 such that at least data for one complete rotation can be obtained (FIG. 3). At the same time as the above detecting operation, the obtained data are processed; for example, the point moved by 0.8 mm in relation to an average moving distance of 20 mm is determined as in the vicinity of notch 20a. Then, center 20c of workpiece 20 is calculated based on a data matrix consisting of four points $(P_{n-1}, P_n, P_{n+1}, P_{n+2})$ in the vicinity of notch 20a as shown in FIG. 4. To calculate the above, first, a slope caused by a deviation of the axis of workpiece 20 is calculated using $P_{n-1}$ and $P_{n+2}$. Then, an angle $\phi$ of notch 20a is calculated using $P_n$ and $P_{+1}$ which are positioned on the edge of notch 20a formed as a right isosceles triangle. At the same time, positioning portion 8 is rotated such that the vicinity of notch 20a is positioned at a given position as a reference. Furthermore, a rotation of the workpiece is performed for a small amount which is calculated based on an estimated shape of notch 20a such that the retained position is finely corrected. As a result, notch 20a is shifted to a given position to be in a uniform direction such that the orientation is complete. FIG. 5 shows an example of a summary of the above calculation process in which the process proceeds from the right to left.

Figure 6:
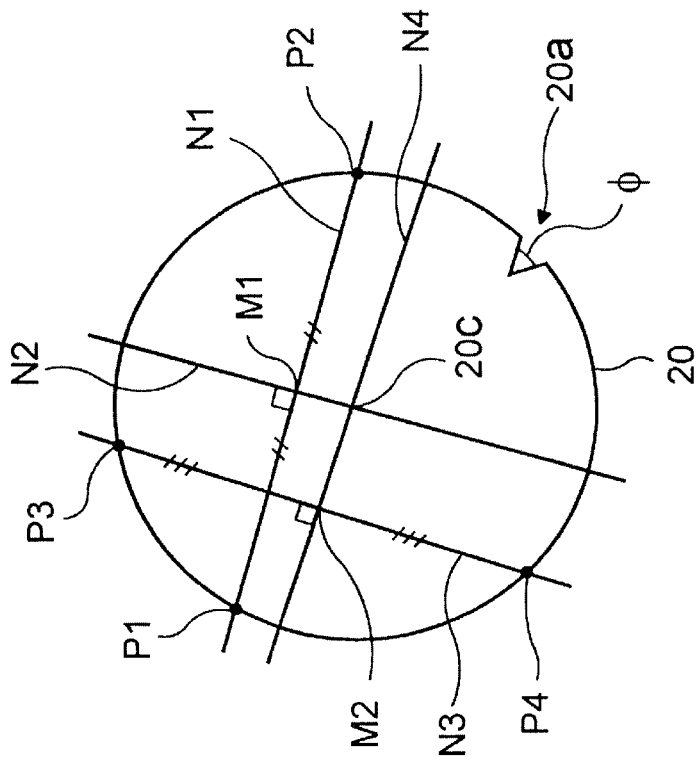
FIG. 6 is a drawing showing a mechanism of detecting the center of a workpiece.
Figure 9:
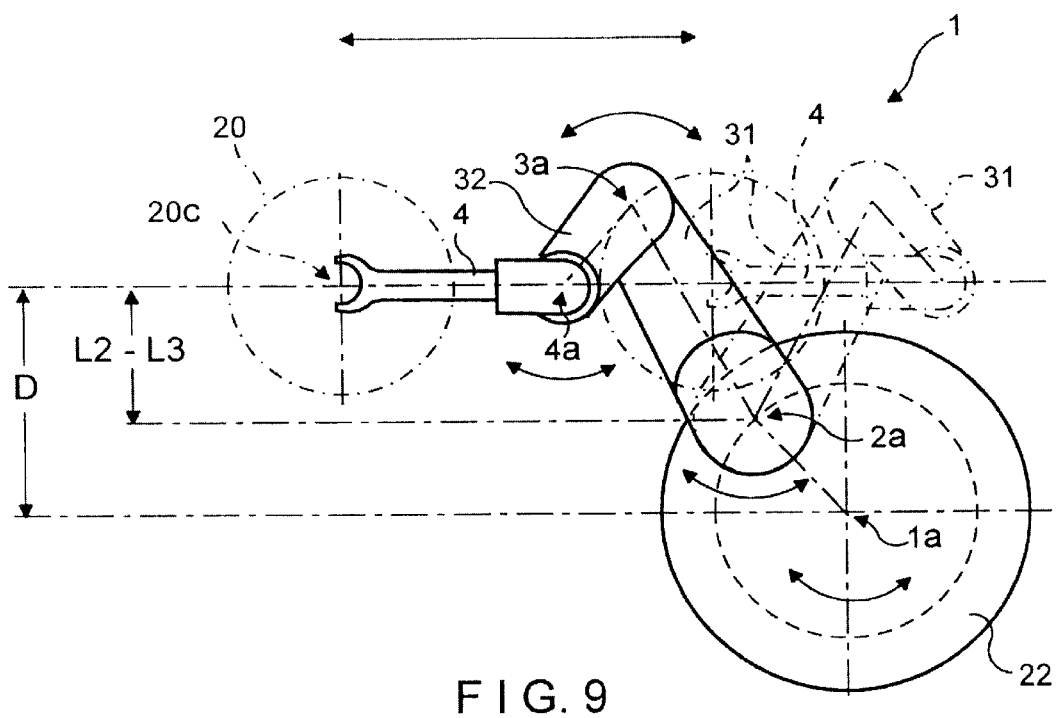
FIG. 9 is a plan view showing yet another example of an articulated robot of the present invention.

The following explains a method to measure deviations of workpiece 20 from the center when workpiece 20 is mounted on positioning portion 8 by using the data obtained by sensor portion 10. The data obtained from the above optical measurement by the line CCD sensor 10 is used for this detection of positional deviations; however, the data regarding notch 20a used for the orientation are supposed to be erased in advance. First, as shown in FIG. 6, two points P1 and P2, which are apart from each other by about 180 degree on the circumference of workpiece 20, are arbitrarily selected. Here, it is defined that a straight line between the two points is N1 and a normal line passing through middle point M1 between P1 and P2 (that is, a bisector perpendicular to line P1P2) is N2. Furthermore, other two points P3, P4 are selected in the same manner wherein a straight line between P3 and P4 is defined as N3 and a normal line passing through middle point M2 between P3 and P4 is defined as N4. In this case, the interception point of N3 and N4 is center 20c of workpiece 20 to be calculated. Also, the center of positioning portion 8 is known in advance such that once center 20c is calculated, the deviation amount of the workpiece from the center of positioning portion 8 can be obtained. Detection of positional deviation 8 can be finished at this point; however, it is desirable to perform more accurate detection by averaging the values obtained from several times of the above analyses for the entire circumference of workpiece 20.

According to articulated robot 1 of the present invention with the above structure, it is possible to perform both detection of positional deviations of workpiece 20 while workpiece 20 is mounted at positioning portion 8 and transfer of workpiece 20 by transferring portion 3. In other words, the orientation function to rotate workpiece 20, that is, detection of positional deviations of workpiece center 20c by using the resulting data and movements of first transferring portion 2 and rotations of second arm 31 to transfer workpiece 20 can be independently performed simultaneously. Therefore, unlike a conventional robot, it is not necessary to pass through aligner 7 formed separate from the robot such that articulated robot 1 can transfer workpiece 20 from cassette 5 to processing device in the shortest distance. Additionally, a space for a separate aligner in a conventional robot is not required any more since aligner 7 is formed together with articulated robot 1; as a result, the space can be effectively used for some other purpose. Moreover, due to the fact that articulated robot 1 and aligner 7 are formed together, it is much easier to adjust the position of aligner 7 when it is replaced.

In the above embodiment, first transferring portion 2 is formed of slide transferring portion 21; however, it can be formed of turn table 22 as shown in FIGS. 7 and 8. As described in detail later, the robot of this embodiment is to prevent generation of singularities. Therefore, such first transferring portion 2 (that is, a turn table) moves in the same manner as the arm in terms of transferring workpiece 20 by rotation; at the same time, it functions as a base to support second transferring portion 3 and positioning portion 8. In the example shown in the figures, a transferring portion is formed such that first arm 31, second arm 32 and hand portion 4 are rotatably connected to turn table 22 as first transferring portion 2 via joint portions 2a, 3a and 4a. In such articulated robot 1, it is also the same as the previous embodiment that the time required for transferring workpiece 20 can be shortened by performing transfer of the workpiece and the orientation simultaneously. Also, it is possible to form first transferring portion 2 which can perform both slide transfer and rotation by combining slide transferring portion 21 and turn table 22.

Figure 10:
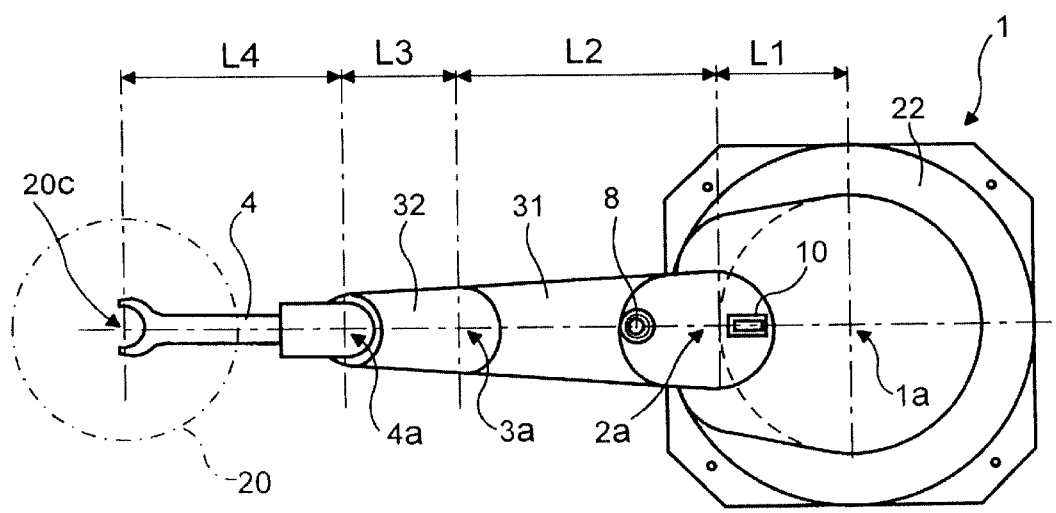
FIG. 10 is a plan view showing each arm portion and a hand portion of the articulated robot shown in FIG. 9.
Figure 11:
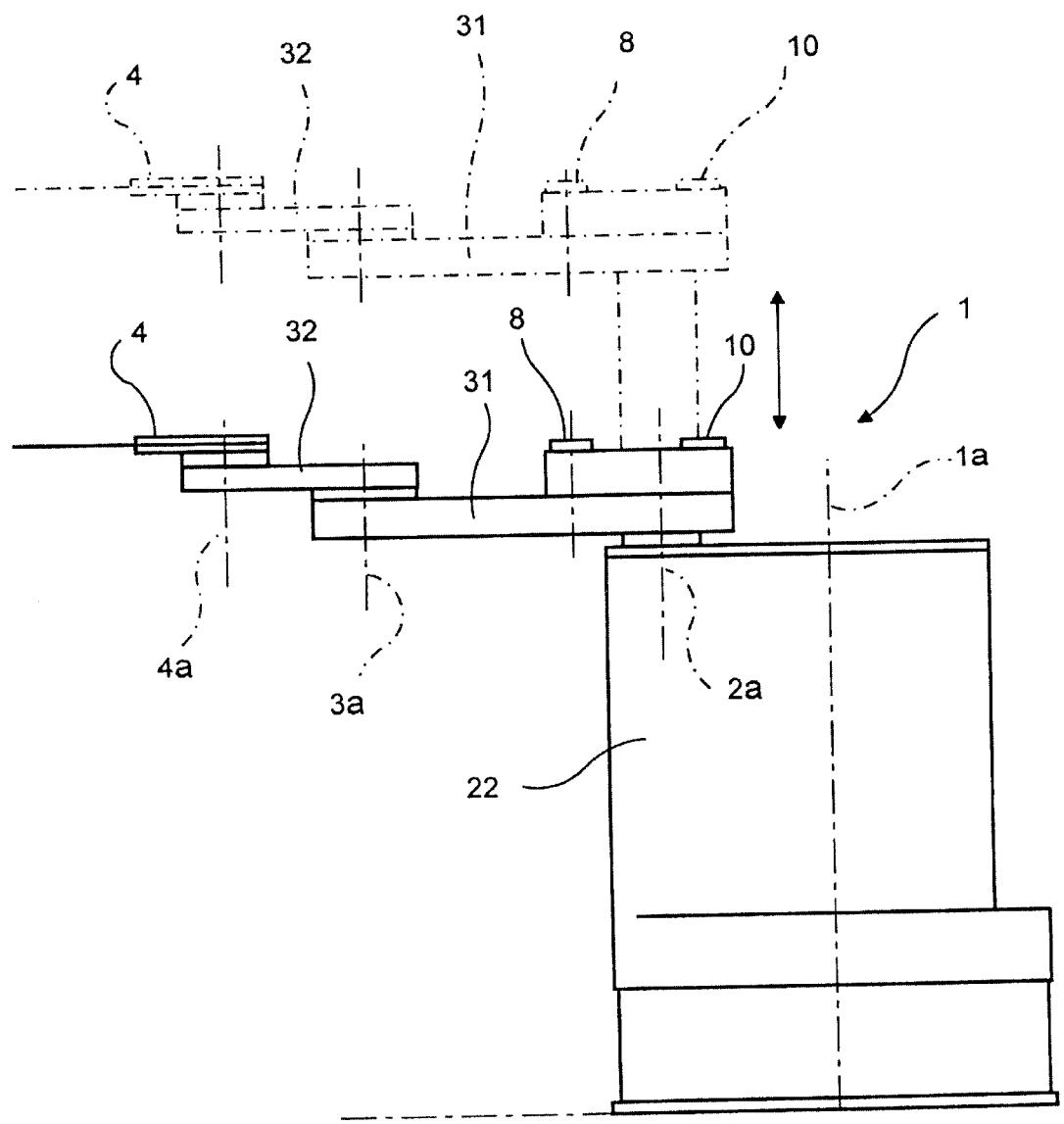
FIG. 11 is a side view showing the articulated robot shown in FIG. 9.

The following describes an embodiment of an articulated robot to transfer a workpiece in which a workpiece can be linearly transferred without unnatural movements in an arm portion. This embodiment also comprises aligner 7 to rotate workpiece 20 and detecting means 10 to detect notch 20a formed on the end of workpiece 20 as shown in FIGS. 10 and 11; however, they are previously described such that any discussion regarding the parts will be omitted herein.

FIGS. 9 through 15 show an embodiment of an articulated robot to which the present invention is applied. In this articulated robot 1, first rotational axis 2a is formed at a position eccentric in relation to rotational center 1a of turn table 22 which is a first arm portion. An arm rotatably supported by first rotational axis 2a is first arm 31. Also, second arm 32 and hand portion 4 are rotatably supported at the end of first arm 31 and at the end of second arm 32, respectively. By controlling the rotations of first arm portion 22, first arm 31, second arm 32 and hand portion 4, first rotational axis 2a is shifted to a position to keep a sufficient distance with the path of the center of workpiece 20 such that generation of singularities is prevented. The following describes a structure to prevent generation of singularities.

First arm portion 22 is formed of a turn table, which is rotatably formed on rotational center 1a. However, one is not limited to the mode of this embodiment; it is possible that it can be structured of an arm which is formed at a fixed base. Since first arm portion 22 is rotatable, it is possible to rotate first rotational axis 2a, first arm 31, second arm 32 and hand portion 4 in order toward the end of the entire arm portion and to stop at an arbitrary position.

First arm portion 22 is formed of a turn table, which is rotatably formed on rotational center 1a. However, one is not limited to the mode of this embodiment; it is possible that it can be structured of an arm which is formed at a fixed base. Since first arm portion 22 is rotatable, it is possible to rotate first rotational axis 2a, first arm 31, second arm 32 and hand portion 4 in order toward the end of the entire arm portion and to stop at an arbitrary position.

Links among first arm portion 22, first arm 31, second arm 32 and hand portion 4 forming articulated robot 1 comprise independent drives such that a link can rotate independent of other links. Therefore, it is possible to produce a motion by one link or motions by a plurality of links combined. Drives are not limited to any specific form; they can be stepping motors or servo motors wherein rotations of each arm portion 22, arms 31 and 32 and hand portion 4 are separately controlled by a controlling means such as a computer.

Similar to first arm 31 being rotatably supported by first rotational axis 2a via a joint portion, second arm 32 and hand portion 4 are rotatably supported by second rotational axis 3a and third rotational axis 4a, respectively. About the length of each link is, as indicated in FIG. 10, distance between axes of first arm portion 22 is L1, distance between axes of first arm 31 is L2, and distance between axes of second arm 32 is L3. Also, a transfer means to transfer workpiece 20 is formed at the end of hand portion 4 such that it can hold workpiece 20 from the bottom by suction. L4 is defined as a length between third rotational axis 4a and the center of the suction means.

Furthermore, in articulated robot 1 of this embodiment, as shown in FIG. 11, arms 31, 32 and hand portion 4 are formed to be movable in the vertical direction all together. Therefore, the degree of freedom of this articulated robot 1 is defined as 5; the robot is formed to be capable of free motion including in the vertical direction. Instead of first arm 31, the same effects can be obtained by forming first arm portion 22 to be movable in the vertical direction.

Figure 12:
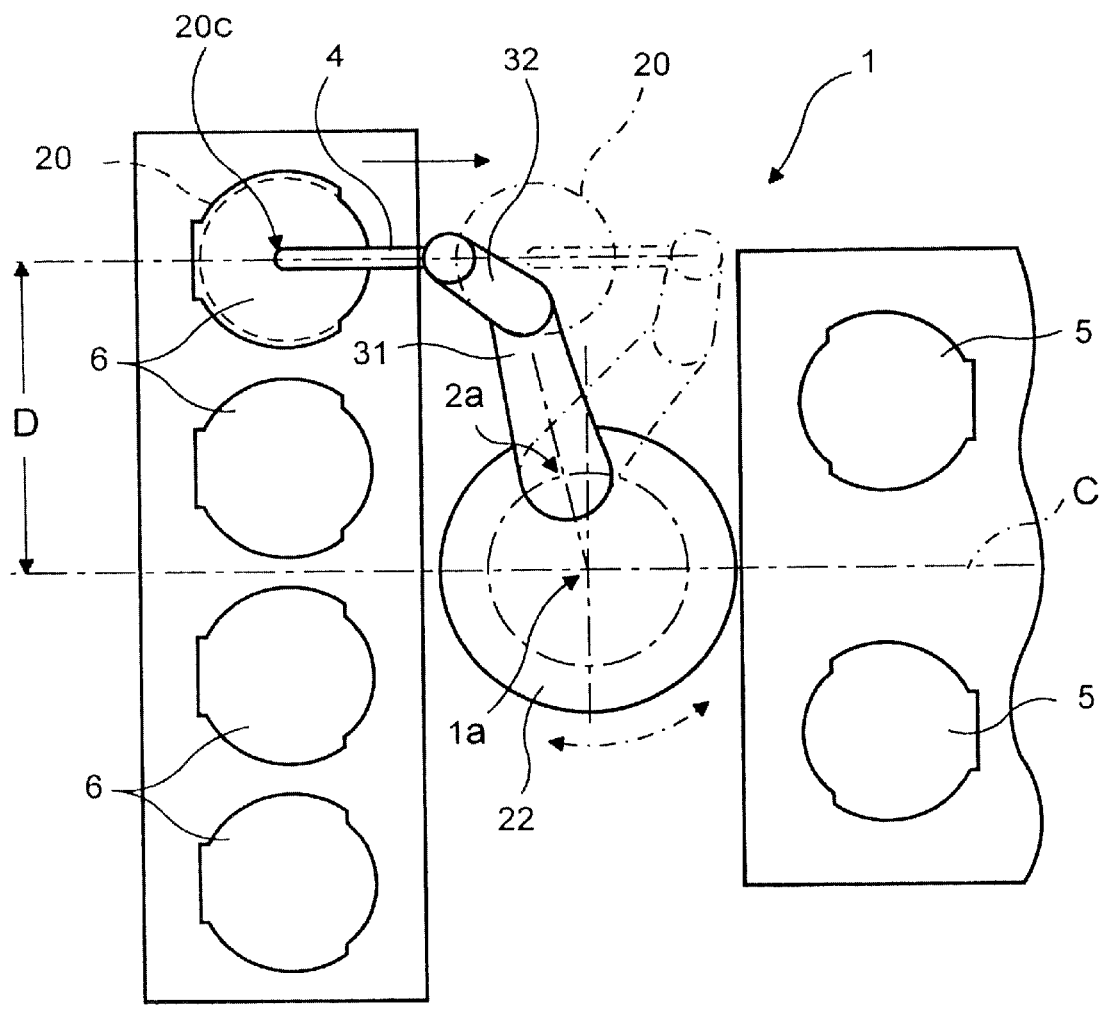
FIG. 12 is a plan view showing a process of removing a workpiece mounted in a cassette by the articulated robot.

The following describes an operation in which articulated robot 1 removes workpieces 20, ..., 20 mounted on processing device 6 as shown in FIG. 12.

It is defined that a line, which passes through rotational center 1a and which is parallel to the direction of a workpiece to be transferred, is center line C, and a distance from the center of workpiece 20c to center line C is offset length D.

Figure 13A:
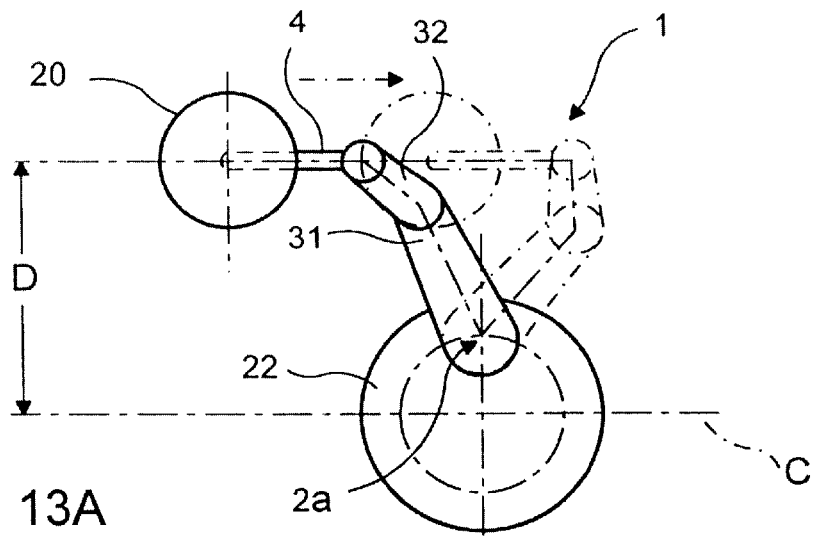
FIGS. 13(A), 13(B) and 13(C) are plan views showing different modes to transfer a workpiece by the articulated robot with different offset lengths D in FIG. 13(A) through FIG. 13(C)
Figure 13B:
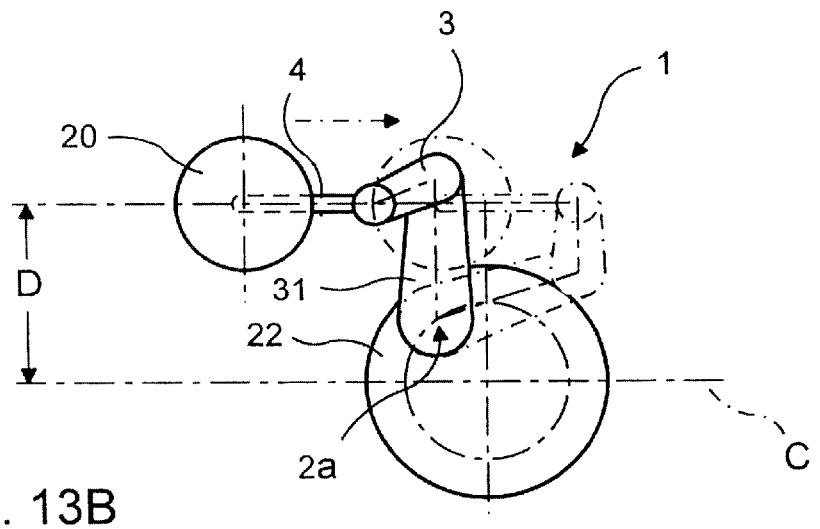
Figure 13C:
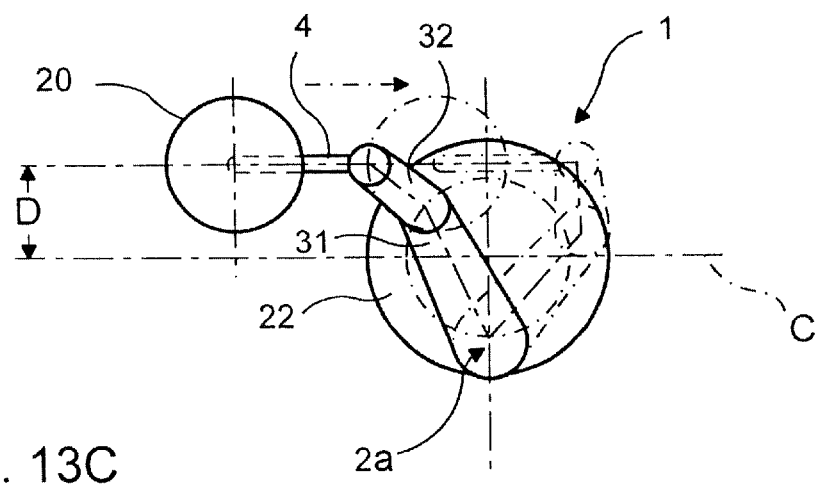
Figure 18:
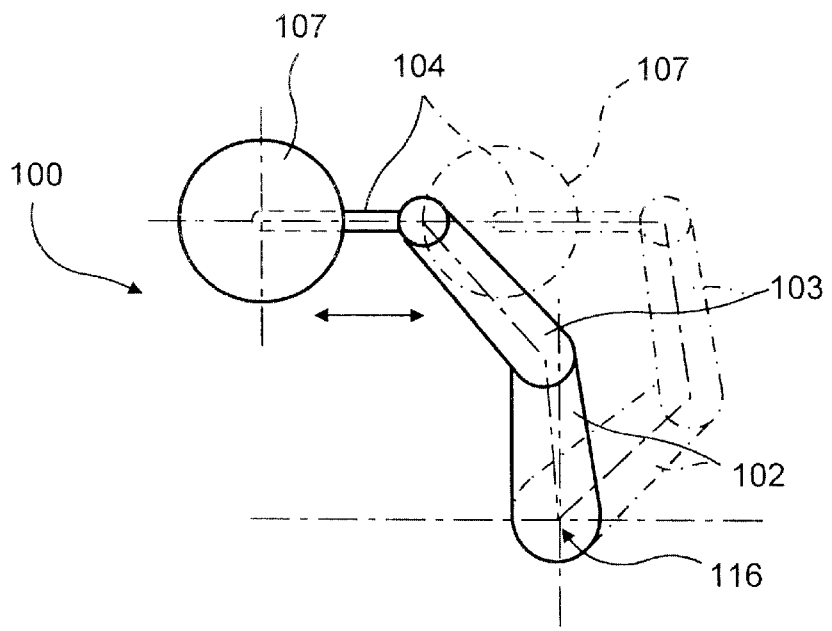
FIG. 18 is a plan view showing a conventional articulated robot.
Figure 16A:
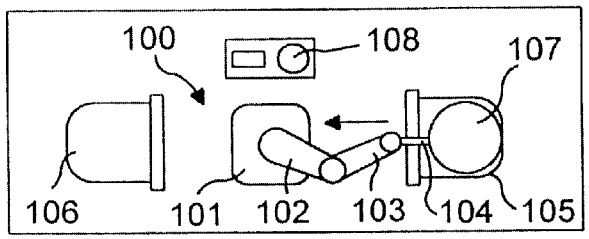
FIGS. 16(A), 16(B), 16(C), 16(D), 16(E) and 16(F) are plan views showing a process of removing a conventional workpiece from a cassette and transferring it via an aligner to a processing device in order of FIG. 16(A) through FIG. 16(F)
Figure 16B:
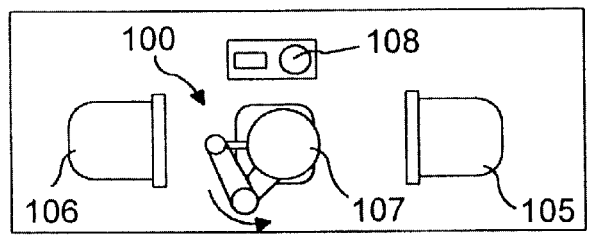
Figure 16C:
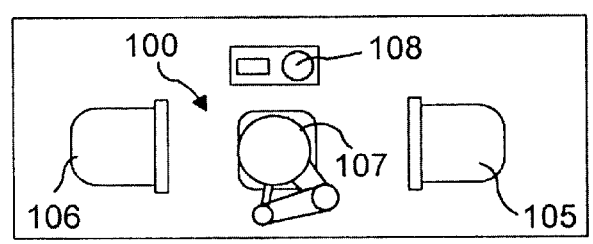
Figure 16D:
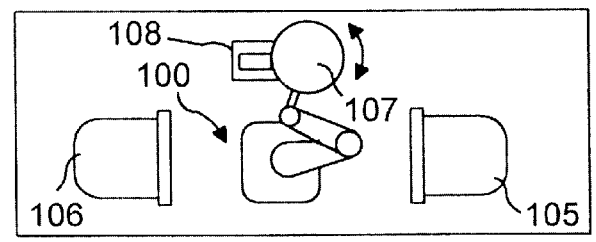
Figure 16E:
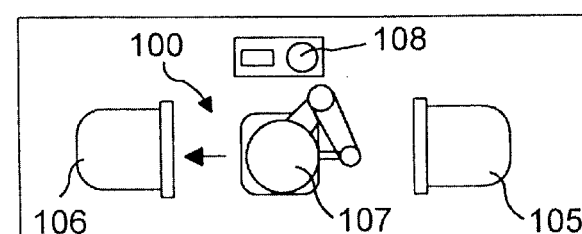
Figure 16F:
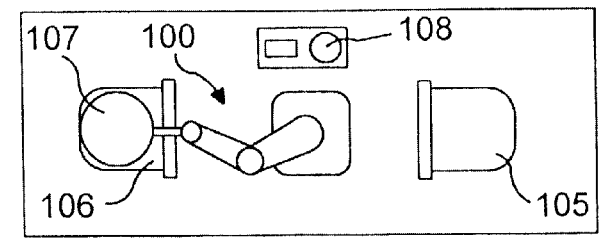
Figure 19:
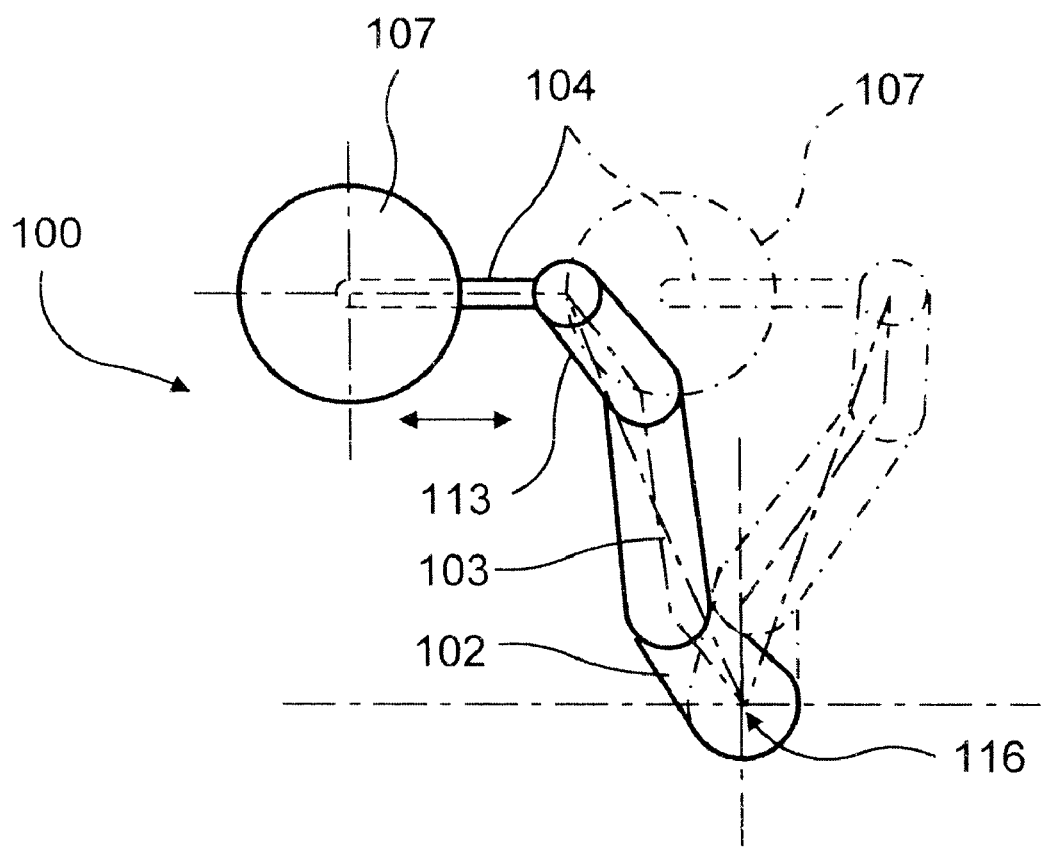
FIG. 19 is a plan view showing a conventional articulated robot with three arms.
Figure 20A:
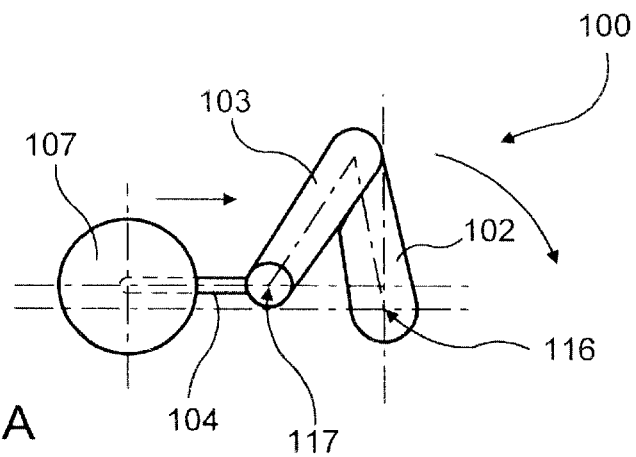
FIGS. 20(A), 20(B) and 20(C) are plan views showing a process of transferring a workpiece in the vicinity of a singularity by the articulated robot shown in FIG.18 in order of FIG. 20(A) through FIG. 20 (C)
Figure 20B:
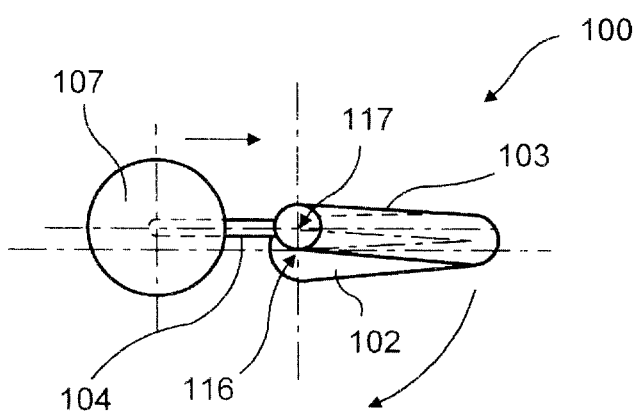
Figure 20C:
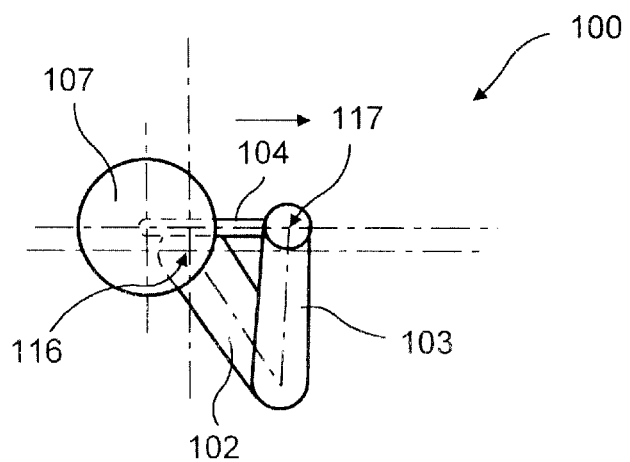
Figure 21A:
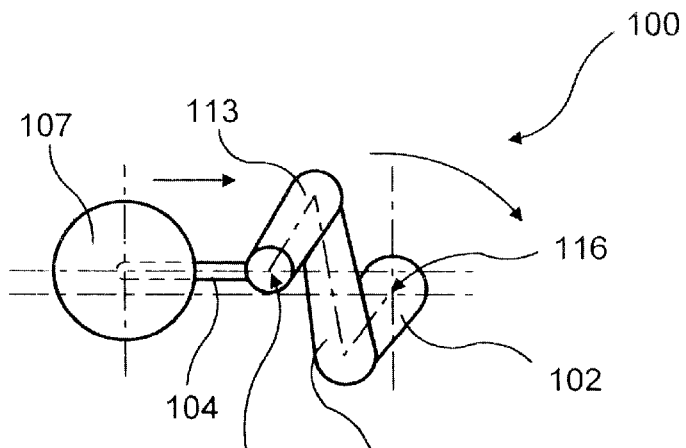
FIGS. 21(A), 21(B) and 21(C) are plan views showing a process of transferring a workpiece in the vicinity of a singularity by the articulated robot shown in FIG.19 in order of FIG. 21(A) through FIG. 21(C)
Figure 21B:
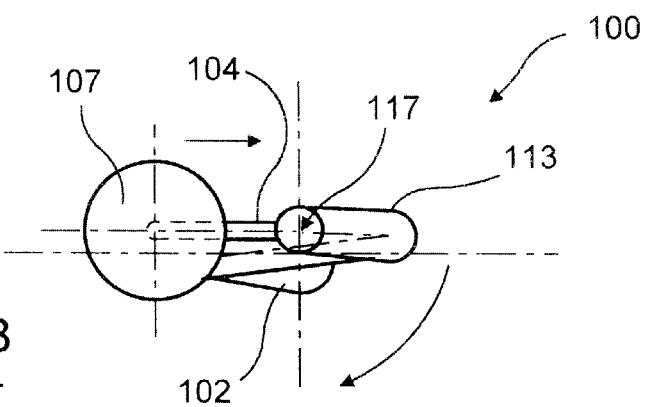
Figure 21C:
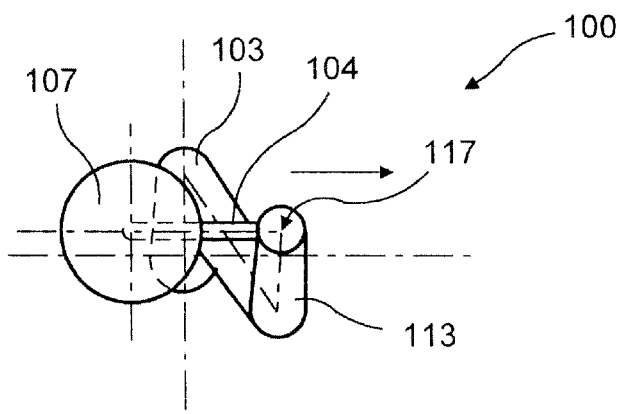
Figure 22:
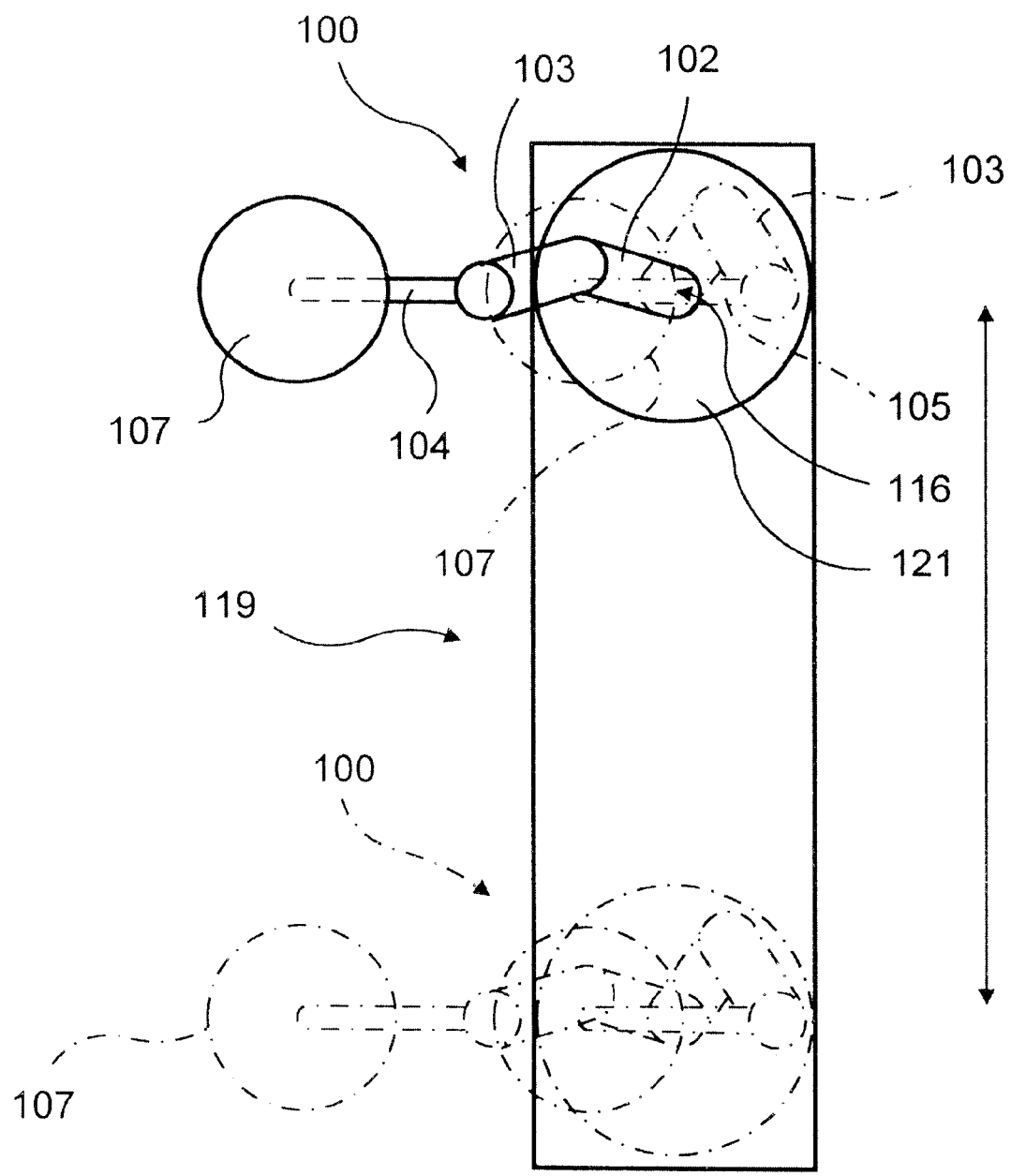
FIG. 22 is a plan view showing a conventional articulated robot having a mechanism for linear movements.

In the case of removing workpiece 20, it is known in advance from which position workpiece 20 is removed. Therefore, first, rotation of first arm portion 22 is controlled such that first arm 31, second arm 32 and hand portion 4 are shifted to an appropriate position in relation to the position of workpiece 20 where singularities are not generated. The appropriate position in this case means a position where generation of singularities is prevented, more specifically, positions indicated in FIGS. (A) through (C). In other words, as shown in FIG. 13, in each mode with different offset length D of workpiece 20, the position of workpiece 20 to be removed is known in advance such that first rotational axis 2a as a rotational axis of first arm 31 is shifted to a position to maintain a sufficient distance in relation to the path of the center of transferred workpiece 20. For example, as shown in FIG. 13(A), first rotational axis 2a is shifted towards workpiece 20 if workpiece 20 is positioned away from first arm portion 22; on the other hand, it is shifted to the lower position in the figure if workpiece 20 is closer to first arm portion 22 such that a distance with the path of the center of workpiece 20 is sufficiently maintained. Similarly, as shown in FIG. 12, first rotational axis 2a is shifted to an appropriate position in relation to each workpiece 20 by rotation of first arm portion 22. When workpiece 20 is removed from lower processing device 6, it is obvious that arms 31, 32 and hand portion 4 are arranged to be symmetric in relation to center line C of FIG. 12. Also, symbol 5 in the figure indicates a cassette.

After first rotational axis 2a is shifted to the appropriate position as above, first arm portion 22 is stopped therein such that workpiece 20 is removed from processing device 6 by first arm 31, second arm 32 and hand portion 4. In this case, first arm 31, second arm 32 and hand portion 4 are linearly shifted while workpiece 20 is removed such that hand portion 4 faces in a constant direction. In other words, when workpiece 20 is transferred by using articulated robot 1, workpiece 20 is linearly transferred by combining rotational movements of each link while an angle of hand portion 4 in relation to the direction of the workpiece to be transferred is maintained zero such that workpiece 20 is linearly and horizontally transferred.

Also, in the embodiment shown in FIGS. 12 and 13, first arm 31 and second arm 32 do not cross while transferring workpeice 20 from processing device 6; however, it is possible to transfer workpeice 20 by crossing the arms. As shown in FIGS. 14(A), (B), during transfer of workpeice 20, third arm 32 is superimposed over first arm 31, and workpeice 20 is continually transferred by rotating arms. In this case, the lengths of axial distances of each arm L1, L2, L3 are not limited to the above; however, as shown in FIG. 14(B), when workpeice 20 is transferred while offset length is zero, it is required to establish a condition where (L2−L3)<L1. When the position of first rotational axis 2a is appropriately established, workpeice 20 can be transferred on a line on which offset length D is between zero and the maximum of (L1+L2−L3).

According to articulated robot 1 with a structure as described above, the position of first rotational axis 2a is shifted to an appropriate position where a distance to the path of the center of workpiece 20 is sufficiently maintained; therefore, the workpiece can be linearly transferred at a position where center of workpiece 20c is distant from first rotational axis 2a. As a result, singularities do not tend to be generated during the linear movement of workpiece 20; also, no unnatural movement is caused in each link when workpiece 20 is transferred at a constant speed.

Furthermore, first arm portion 22 of this embodiment is formed of a turn table such that generation of dust is minimized during rotational shift of second arm 31, and space required for the design is reduced.

Also, in the above embodiment, when hand portion 4 is linearly moved, the direction of the axis of hand portion 4 and the direction of the workpiece to be transferred are the same. However, as shown in FIG. 15, by transferring the workpiece while axis 4c of hand portion 4 is tilted in relation to the direction of the workpiece to be transferred, it is possible to remove workpiece 20 from a position located further than as in the above embodiment for transfer. However, in this case, it is necessary to prevent interference of hand portion 4 and processing device 6; additionally, the angle of axis 4c shall be constant in order to transfer workpiece 20 without rotation.

As is apparent from the above, in an articulated robot of the present invention, a positioning portion for a workpiece and sensor portion to detect positional deviations of the workpiece are positioned at a transferring portion such that detection by the sensor portion while the workpiece is positioned at the positioning portion and transfer of the workpiece by the transferring portion thereat. Hence, transfer of the workpiece and detection of the positional deviations of the workpiece can be performed independently. As a result, the positional deviations of the workpiece are detected while the workpiece is transferred such that a time required for transfer of the workpiece from a cassette to a processing device, or vice versa an be shortened. Additionally, both the positioning portion for the workpiece and the sensor portion are formed on the articulated robot such that a space can be effectively used compared to an articulated robot from which the two portions are formed separate.

Also, in the articulated robot of the present invention, a chain connection is formed by links among a first arm portion, second arm, third arm and hand portion to transfer a workpiece; additionally, rotation of each link is independently controlled such that a first rotational axis as the rotational axis of the second arm can be rotationally shifted by rotating the first arm portion. Therefore, generation of singularities can be prevented during transfer of the workpiece. As a result, the workpiece at various locations can be linearly transferred without causing unnatural movements in the arm portions; furthermore, the speed at which the workpiece is transferred can be maintained constant.

Moreover, in the articulated robot of the present invention, the first arm portion is formed of a turn table such that generation of dust is minimized; also, the robot is space-effective. Therefore, it is suitable for a use in a clean room.

While the foregoing description and drawings represent the preferred embodiments of the present invention, it will be obvious to those skilled in the art that various changes and modifications may be made therein without departing from the true spirit and scope of the present invention.

What is claimed is:

1. An articulated robot comprising:
   a movable base rotatable about a rotation center;
   a first arm connected to said movable base by a first rotational axis;
   a second arm connected to said first arm by a second rotational axis;
   a workpiece positional deviation detecting means located on said first arm for detecting and correcting the amount of deviation in the rotational orientation of a workpiece placed therein with respect to a desired rotational orientation, which workpiece positional deviation detecting means comprises:
     a positioning portion for positioning the workpiece said positioning portion comprising a rotating means to rotate said workpiece, and
     a sensor portion for detecting a given orientation of said workpiece, said positioning portion and said sensor portion being formed on said first arm; and
     a hand portion formed at an end of said second arm for positioning the workpiece in said workpiece positional deviation detecting means;
   wherein the detecting and correcting operations and the transferring operation performed by movement of said moveable base and said first arm and said second arm are enabled while the workpiece has been positioned in said workpiece positional deviation detecting means wherein said moveable base is a turn table.

2. The articulated robot described in claim 1 wherein:
   said positioning portion comprises a rotating means to rotate said mounted workpiece; and
   said sensor portion comprises a sensing means for detecting a given position of the end of said workpiece.

3. The articulated robot described in claim 1 wherein:
   said moveable base is a slide transferring portion; and
   said first arm, said second arm and said hand portion are rotatably connected to said slide transferring portion by joint portions.

4. The articulated robot described in claim 1 wherein:
   said moveable base is a turn table; and
   said turn table being rotatably connected to said first arm, said second arm and said hand portion by joint portions.

5. The articulated robot described in claim 1 wherein:
   said moveable base is a turntable;
   said first rotational axis being formed at a position eccentric in relation to the rotational center of said turn table;
   an arm, which is rotatably supported by said first rotational axis, being assigned as a first arm;
   a second arm being rotatably supported at an end of said first arm;
   a hand portion being rotatably supported at an end of said second arm; and
   generation of singularities being prevented by separately controlling rotations of said moveable base, said first arm, said second arm and said hand portion.

6. The articulated robot described in claim 5 wherein said first arm and said second arm carry out linear movement of said hand portion while said hand portion is positioned to face one direction such that generation of singularities is prevented by controlling the rotation of said first arm.

7. The articulated robot described in claim 6 wherein generation of singularities is prevented by shifting the position of said rotational axis until a sufficient distance with a path of linear movement of said hand portion is obtained.

8. The articulated robot described in claim 7 wherein the following is true:

$$(L2-L3) \leq L1;$$

where:
   L1=distance between axes of said moveable base;
   L2=distance between axes of said first arm; and
   L3=distance between axes of said second arm.

9. An articulated robot comprising:
   a moveable base rotatable about a rotation center;
   a first arm connected to said moveable base by a rotational axis;
   a second arm rotatably connected by a joint portion to said second rotational axis;
   a workpiece positional deviation detecting means located on said first arm comprising;
   a positioning portion and a sensor portion for detecting positional deviations of a workpiece;
   wherein said sensor portion enables transfer of said workpiece by rotation of said first arm being performed while said workpiece is positioned at said positioning portion.

* * * * *